United States Patent
Shibayama

(10) Patent No.: US 7,237,562 B2
(45) Date of Patent: Jul. 3, 2007

(54) SUBSTRATE PROCESSING APPARATUS AND CONTROL METHOD OF INERT GAS CONCENTRATION

(75) Inventor: Nobuyuki Shibayama, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 198 days.

(21) Appl. No.: 10/463,064

(22) Filed: Jun. 17, 2003

(65) Prior Publication Data
US 2003/0234030 A1  Dec. 25, 2003

(30) Foreign Application Priority Data
Jun. 20, 2002  (JP)  ............... P2002-179795
Apr. 8, 2003  (JP)  ............... P2003-104147

(51) Int. Cl.
*B08B 3/00* (2006.01)
(52) U.S. Cl. ............... 134/56 R; 134/102.1; 134/902
(58) Field of Classification Search ............ 134/102.1, 134/102.2, 56 R, 902
See application file for complete search history.

(56) References Cited

U.S. PATENT DOCUMENTS

| | | | | | |
|---|---|---|---|---|---|
| 5,800,626 | A | * | 9/1998 | Cohen et al. | 134/1.3 |
| 6,017,827 | A | * | 1/2000 | Morgan et al. | 438/745 |
| 6,039,055 | A | * | 3/2000 | Akatsu | 134/1.3 |
| 6,053,058 | A | * | 4/2000 | Hayashi et al. | 73/863.01 |
| 6,082,373 | A | * | 7/2000 | Sakurai et al. | 134/1 |
| 6,167,891 | B1 | * | 1/2001 | Kudelka et al. | 134/1.3 |
| 6,290,777 | B1 | * | 9/2001 | Imaoka et al. | 134/1 |
| 6,295,998 | B1 | * | 10/2001 | Kudelka et al. | 134/1.3 |
| 6,372,699 | B1 | * | 4/2002 | Morita et al. | 510/175 |
| 6,450,181 | B1 | * | 9/2002 | Morita et al. | 134/1.3 |
| 6,509,305 | B1 | * | 1/2003 | Mitsumori et al. | 510/175 |
| 6,510,859 | B1 | * | 1/2003 | Kamikawa | 134/61 |
| 6,521,049 | B1 | * | 2/2003 | Rolfson | 134/10 |
| 6,716,477 | B1 | * | 4/2004 | Komiyama et al. | 427/8 |
| 6,766,818 | B2 | * | 7/2004 | Kashkoush et al. | 137/3 |
| 2002/0108641 | A1 | * | 8/2002 | Lee et al. | 134/30 |
| 2003/0122268 | A1 | * | 7/2003 | Nagasaka et al. | 261/122.1 |
| 2003/0150477 | A1 | * | 8/2003 | Suzuki | 134/1.3 |
| 2004/0012104 | A1 | * | 1/2004 | Ozawa et al. | 261/122.1 |

FOREIGN PATENT DOCUMENTS

JP  8-196879  8/1996

OTHER PUBLICATIONS

English translation of Abstract for Japanese Patent Application Laid-Open No. 8-196879 (1996).

* cited by examiner

*Primary Examiner*—Michael Barr
*Assistant Examiner*—Sarah E. Husband
(74) *Attorney, Agent, or Firm*—Ostrolenk, Faber, Gerb & Soffen, LLP

(57) ABSTRACT

Provided is a substrate processing apparatus capable of supplying pure water that is stabilized with respect to the concentration of nitrogen gas. First and second nitrogen concentration meters to measure the nitrogen gas concentration of pure water are respectively disposed before and after a concentration change part that can dissolve and degas nitrogen gas by using a hollow fiber type separation membrane. In order to maintain the nitrogen gas concentration of pure water at a target concentration value, the dissolution and degassing in the concentration change part are controlled by adjusting the degree to which a first valve on a nitrogen gas supply path and a second valve on a nitrogen gas degassing path are opened, based on a concentration difference between a target concentration and both of the first and second nitrogen concentration meters.

7 Claims, 14 Drawing Sheets

F I G . 3
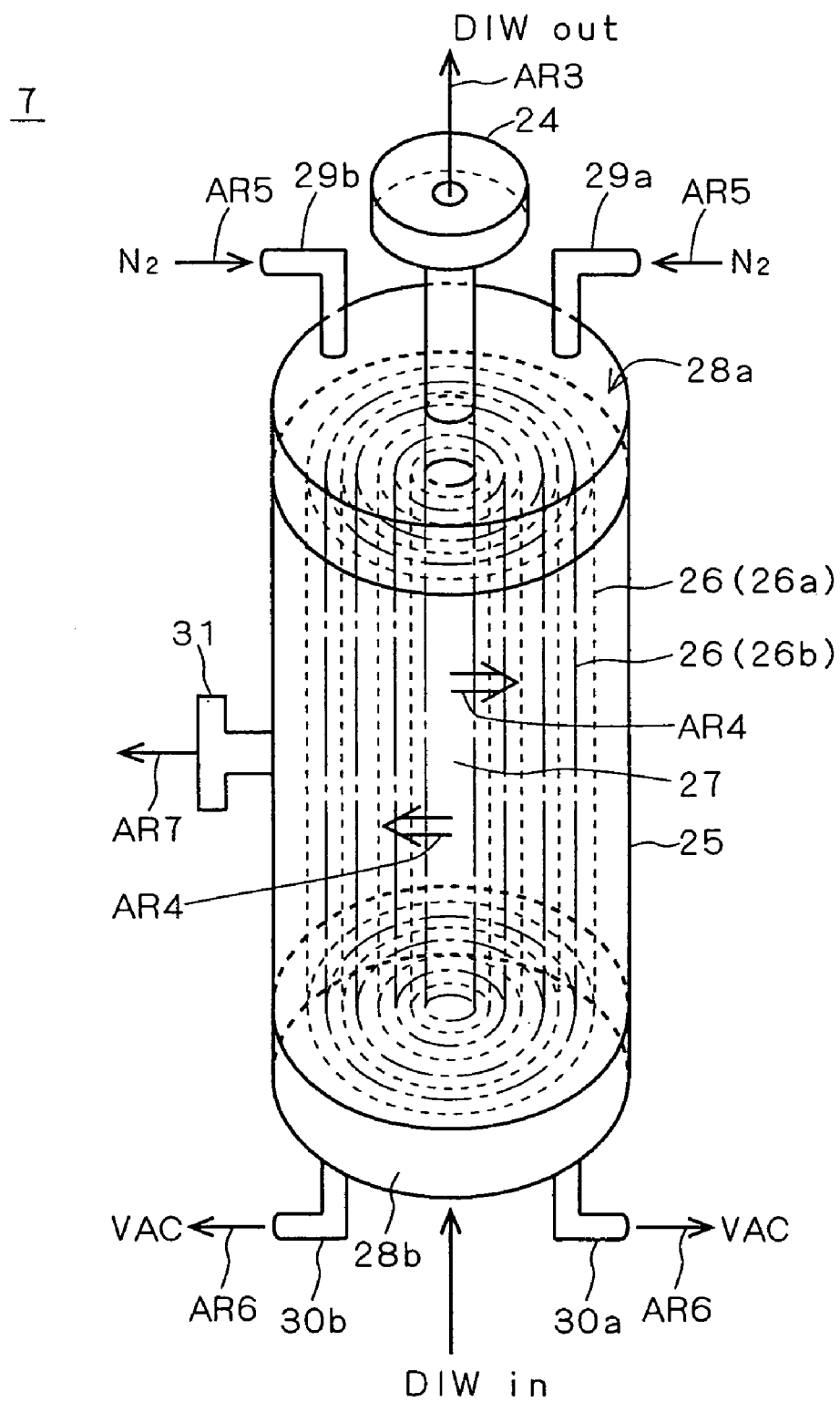

SUBSTRATE PROCESSING APPARATUS AND CONTROL METHOD OF INERT GAS CONCENTRATION

BACKGROUND OF THE INVENTION

1. Field of the Invention

The present invention relates to a substrate processing apparatus used when a substrate such as a semiconductor wafer is subjected to a predetermined process such as a cleaning process, and a technique of controlling the inert gas concentration of a processing liquid.

2. Description of the Background Art

In a substrate cleaning process performed in the manufacturing process of a semiconductor device and the like, pure water, or a mixed liquid of pure water and hydrogen peroxide, ammonium etc. is used as a processing liquid. For example, a megasonic cleaning apparatus employs in some times such a processing liquid that is obtained by dissolving nitrogen gas, as an inert gas, in pure water under atmospheric pressure so as to have a concentration of approximately from 5 ppm to 20 ppm, in order to increase the efficiency of cleaning.

FIG. 13 is a diagram showing a conventional substrate processing apparatus 1000. The apparatus 1000 comprises mainly a pure water adjusting part 1001 and a processing part 1012.

The pure water adjusting part 1001 adjusts the nitrogen gas concentration of pure water to a predetermined concentration and then supplies it to the processing part 1012 that performs, for example, megasonic cleaning. The pure water so adjusted is obtained by dissolving nitrogen gas that is supplied from a nitrogen supply source 1004 provided as factory utility and the like via a nitrogen gas supply path 1005, in pure water that is supplied from a pure water supply source 1002 provided as factory utility and the like via a pure water supply path 1003.

The pure water adjusting part 1001 comprises a dissolving part 1006 for dissolving nitrogen in pure water supplied from the pure water supply source 1002, a nitrogen concentration meter 1007 for measuring the nitrogen gas concentration of the pure water passing through the dissolving part 1006, a pressure gauge 1008 for measuring the pressure of nitrogen gas supplied through the nitrogen gas supply path 1005, a flow meter 1009 for measuring the flow of nitrogen gas, a valve 1010, and a control part 1011 for controlling the opening and closing of the valve 1010, based on measurements of the nitrogen concentration meter 1007.

FIG. 14 is a diagram showing a sequence of operating steps for dissolving nitrogen gas in the pure water adjusting part 1001, such that the nitrogen gas concentration of pure water has a predetermined target concentration C. As shown in FIG. 13, in the pure water adjusting part 1001, firstly, the supply of nitrogen gas to the dissolving part 1006 is stopped, and an initial nitrogen gas concentration C0, corresponding to the nitrogen gas concentration in the state that no nitrogen gas is dissolved in pure water, (i.e., blank data) is taken by the nitrogen concentration meter 1007 (step S1001). Subsequently, a required dissolution concentration ΔC is found by subtracting the obtained initial nitrogen gas concentration C0 from the target concentration C (step S1002). A target gas pressure Pt to the required dissolution concentration ΔC is found from a chart indicating the relationship between pressure and dissolved concentration (step S1003). Next, a gas flow Ft to the target gas pressure Pt is found from a chart indicating the relationship between pressure and flow (step S1004), and a gas pressure rising time T to the target gas pressure Pt is found from a chart indicating the relationship between pressure and pressure rising time (step S1005).

Thus, the initial setting value is determined, and a nitrogen dissolving process based on this value is started (step S1006). Thereafter, the nitrogen concentration meter 1007 sequentially measures nitrogen gas concentration, and the gas flow and gas pressure are controlled proportionally based on the measured value (step S1007). This enables to supply pure water in which nitrogen gas of a target concentration is dissolved.

Such nitrogen dissolving process is disclosed, for example, in Japanese Patent Application Laid-Open No. 8-196879.

However, the nitrogen dissolving process in the conventional substrate processing apparatus suffers from the following problem.

Specifically, the initial nitrogen gas concentration C0 in the pure water supplied to the dissolving part 1006 can vary depending on the pure water manufacturing circumstances and storage environment in the pure water supply source 1002. When the supplied pure water has a higher nitrogen gas concentration than the target concentration C, the conventional method fails to reduce this concentration due to lack of the function of degassing nitrogen gas in the dissolving part 1006. In this case, it is therefore unavoidable that pure water having a higher nitrogen gas concentration than the target concentration C is supplied to the processing part 1012.

For example, when performing a megasonic cleaning in the processing part 1012, even with the same input electric power, the physical energy intensity exerted on the substrate varies depending on the nitrogen gas concentration. Since this variation affects the effect of cleaning a substrate, the use of pure water having a higher nitrogen gas concentration than the target concentration C lowers the percentage of removal of particles PRE or damages substrates to be processed in the processing part 1012, resulting in poor manufacturing yield.

SUMMARY OF THE INVENTION

The present invention is directed to a technique of controlling a concentration of an inert gas of a processing liquid used when a cleaning process is performed in a substrate processing apparatus for processing a substrate such as a semiconductor wafer.

According to one aspect the present invention, a substrate processing apparatus includes a processing part, a processing liquid supply path and a controlling element. The processing part performs a predetermined process of a substrate with a processing liquid. The processing liquid supply path supplies a processing liquid to the processing part. The processing liquid supply path has a first measuring element, a concentration change element and a second measuring element. The first measuring element obtains a first measured concentration value by measuring a concentration of an inert gas of the processing liquid in a first state. The concentration of the inert gas of the processing liquid in the first state is not adjusted. The concentration change element changes the processing liquid into a second state by changing the concentration of the inert gas of the processing liquid in the first state. The second measuring element obtains a second measured concentration value by measuring the concentration of the inert gas of the processing liquid in the second state. The controlling element controls the concentration of the inert gas of the processing liquid in the second state toward a predetermined target concentration by controlling the concentration change element.

With this configuration, the concentration change element can be controlled while checking a change of the concentration of the inert gas before and after changing the concentration. This permits a further increase in the stability of the concentration of the inert gas of the processing liquid.

According to another aspect of the present invention, a substrate processing apparatus includes a processing part, a processing liquid supply path, a gas path, a gas pressure change element and a concentration controlling element. The processing part performs a predetermined process of a substrate with a processing liquid. The processing liquid supply path supplies the processing liquid to the processing part. The gas path, through which an inert gas passes, has a gas dissolving part for dissolving the inert gas in the processing liquid in the processing liquid supply path. The gas pressure change element changes the pressure of the inert gas in the gas path. The concentration controlling element adjusts the concentration of the inert gas of a processing liquid by controlling the gas pressure change element.

With this configuration, the inert gas pressure that can be controlled easily is controlled to adjust the concentration of the inert gas of a processing liquid, thereby facilitating control of the concentration of the inert gas in the processing liquid. The proportionality between pressure and concentration leads to superior response to control and superior concentration stability.

Accordingly, it is an object of the present invention to provide a substrate processing apparatus capable of supplying pure water that is stabilized with respect to the concentration of an inert gas such as nitrogen gas.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a diagram showing schematically the configuration of a concentration change part;

DESCRIPTION OF THE PREFERRED EMBODIMENTS

First Preferred Embodiment

<Overall Configuration>

Figure 1:
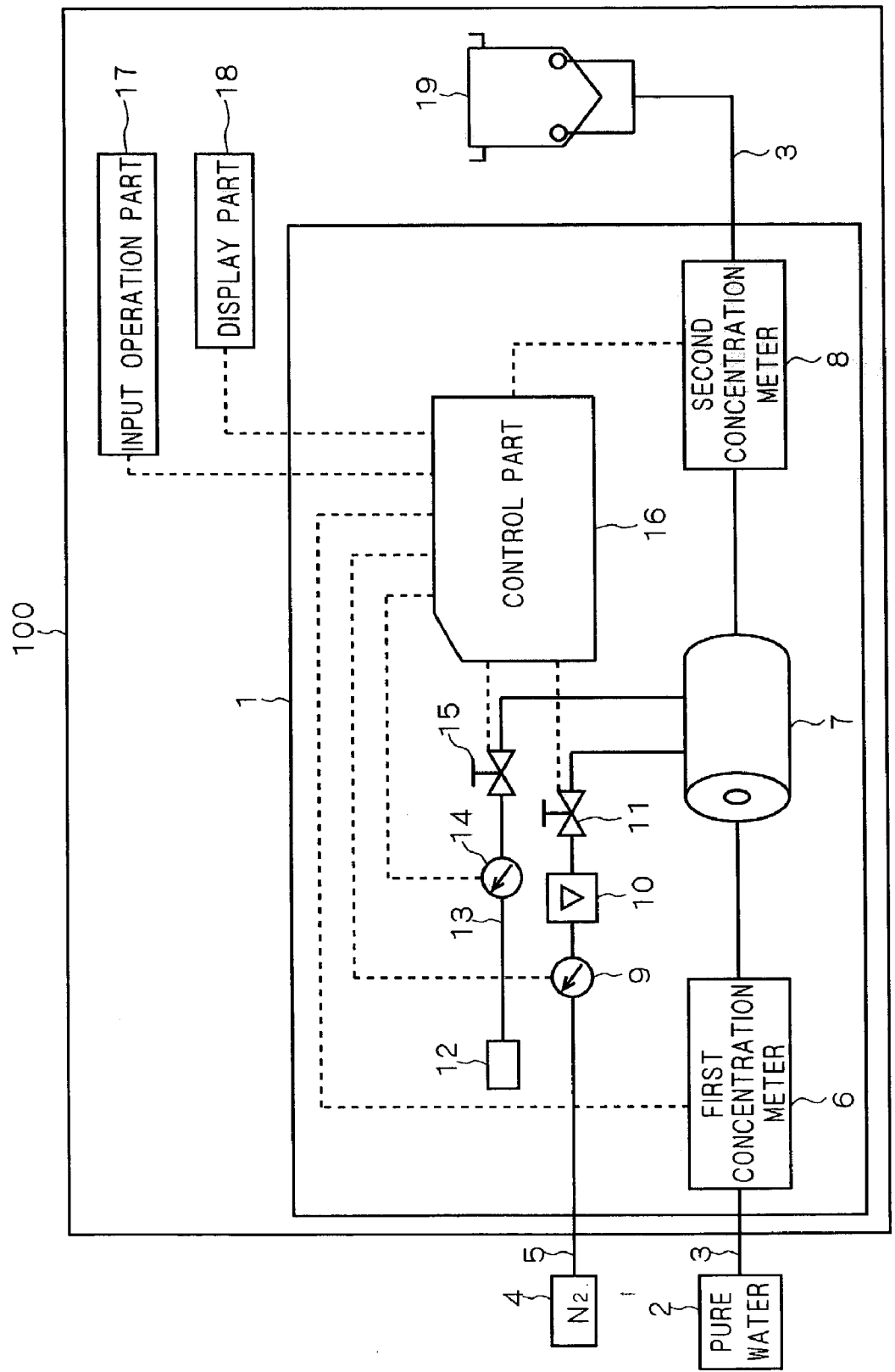
FIG. 1 is a diagram showing a substrate processing apparatus according to a first preferred embodiment of the present invention.

FIG. 1 is a diagram showing a substrate processing apparatus 100 according to a first preferred embodiment of the present invention. The apparatus 100 comprises mainly a pure water adjusting part 1, an input operation part 17, a display part 18, and a processing part 19.

The pure water adjusting part 1 adjusts the nitrogen gas concentration of pure water to a predetermined concentration by dissolving nitrogen gas that is supplied via a nitrogen gas supply path 5 from a nitrogen gas supply source 4 provided as a factory's utility and the like, in pure water that is supplied via a pure water supply path 3 from a pure water supply source 2 provided as a factory's utility and the like. The pure water adjusting part 1 then supplies the adjusted pure water to the processing part 19.

The pure water adjusting part 1 comprises mainly a first nitrogen concentration meter 6 for measuring the nitrogen gas concentration of the pure water supplied from the pure water supply source 2, a concentration change part 7 for dissolving nitrogen gas in pure water or degassing nitrogen gas from pure water, and a second nitrogen concentration meter 8 for measuring the nitrogen gas concentration of the pure water passing through the concentration change part 7.

Figure 2:
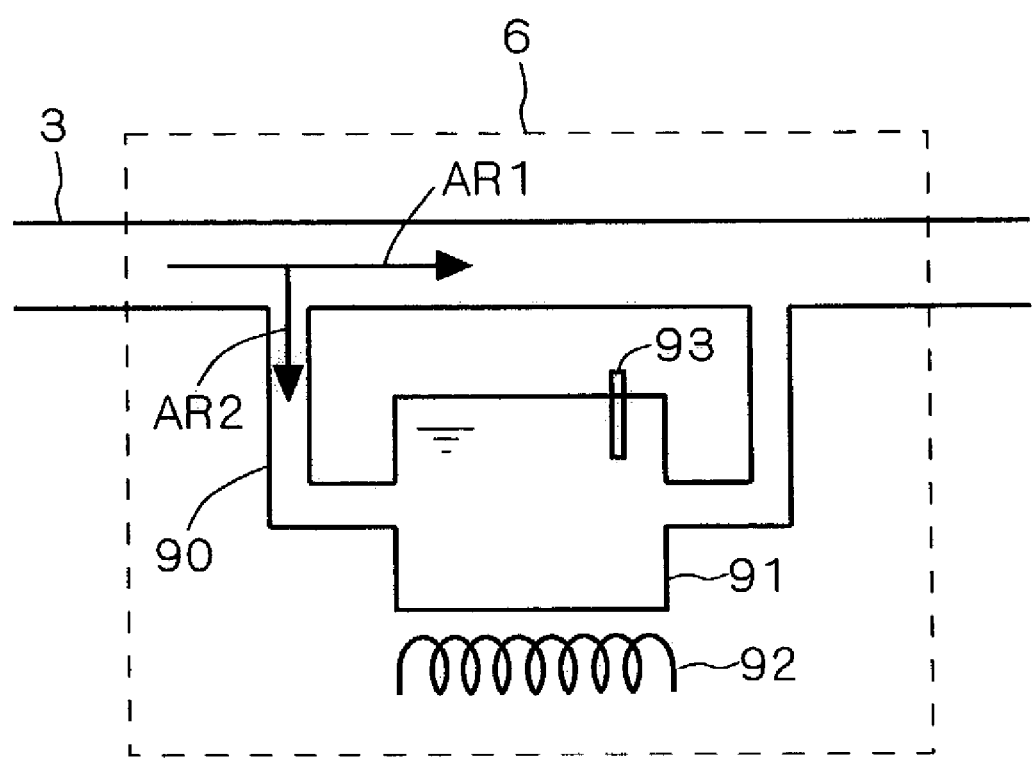
FIG. 2 is a diagram showing conceptually the principle that a nitrogen concentration meter makes a measurement.

The first and second nitrogen concentration meters 6 and 8 have the same configuration and function, the both of which are arranged in line on the pure water supply path 3 in order to measure the concentration of nitrogen at certain time intervals. FIG. 2 is a diagram showing conceptually the principle that a measurement is made by the first nitrogen concentration meter 6, for example. The first nitrogen concentration meter 6 is configured as follows. That is, part of the pure water passing through the pure water supply path 3 in the direction indicated by arrow AR1 is branched by a branch pipe 90 into the direction indicated by arrow AR2, and the pure water is sampled into a measuring tank 91 at certain time intervals. Then, a heater 92 heats the sampled pure water in the measuring tank 91, and a probe 93 measures its temperature. The thermal conductivity of the sampled pure water is found from data of temperature changes so obtained. The thermal conductivity is increased with increasing the concentration of the dissolved nitrogen gas. Based on this correlation, the nitrogen gas concentration of the sampled pure water is obtained.

The concentration change part 7 changes the nitrogen gas concentration of pure water by dissolving nitrogen gas in pure water or degassing nitrogen gas from pure water, through a hollow fiber type separation membrane having gas permeability and liquid impermeability. On the nitrogen gas supply path 5 supplying nitrogen gas to the concentration change part 7, there are disposed a first pressure gauge 9 that measures the pressure of nitrogen gas supplied from a nitrogen gas supply source 4, a flow meter 10 for measuring its flow, and a first valve 11 that can adjust the flow of nitrogen gas. The pure water adjusting part 1 further includes a vacuum pump 12 that can perform evacuation in order to degas nitrogen gas in the concentration change part 7. On a nitrogen gas degassing path 13 extending from the concentration change part 7 to the vacuum pump 12, there are disposed a second pressure gauge 14 that measures the pressure obtained by the vacuum pump 12, i.e., the degree of vacuum, and a second valve 15 that can adjust the degree of vacuum. By adjusting the degree to which the first and second valves 12 and 15 are opened, the flow of nitrogen gas and the degree of vacuum are adjustable, respectively. This also enables to adjust the rate of dissolution of inert gas in a processing liquid and the rate of degassing of inert gas from the processing liquid.

FIG. 3 is a diagram showing schematically the configuration of the concentration change part 7. Referring to FIG. 3, the concentration change part 7 comprises mainly (i) a body part 25 to exercise concentration change processing; (ii) a delivery opening 24 locating at a first end part 28a, through which pure water that is supplied from the pure water supply path 3 (FIG. 1) is delivered to a body part 25 via a water supply opening (not shown) in the direction indicated by arrow AR3; (iii) a delivery opening 31 locating at a side surface of the body part 25, through which pure water after being subjected to concentration change processing is delivered in the direction indicated by arrow AR7; and (iv) first gas inlet/outlet parts 29a, 29b and second gas inlet/outlet parts 30a, 30b, which are provided in first and second end parts 28a and 28b, respectively, and can independently supply or exhaust gas. In the first preferred embodiment, nitrogen gas is supplied under pressure from the first gas inlet/outlet parts 29a and 29b in the direction indicated by arrow AR5, and then evacuated through the second gas inlet/outlet parts 30a and 30b in the direction indicated by arrow AR6.

A water supply pipe 27 is disposed at the center in a longitudinal direction of the body part 25. The water supply pipe 27 is connected to the delivery opening 24 and supplies pure water in its periphery in the direction indicated by arrow AR4. In the periphery of the water supply pipe 27, a number of hollow fiber type separation membranes 26 in a fine cylindrical shape are arranged coaxially along the water supply pipe 27 of the body part 25. The hollow fiber type separation membrane 26 can be classified into a first hollow fiber type separation membrane 26a connected at its end part to the first gas inlet/outlet parts 29a and 29b; and a second hollow fiber type separation membrane 26b connected at its end part to the second gas inlet/outlet parts 30a and 30b, although their details are not shown.

In the first preferred embodiment, nitrogen gas is supplied under pressure from the first gas inlet/outlet parts 29a and 29b, as described above. Therefore, when the inside of the body part 25 is filled with the pure water supplied from the water supply pipe 27, there occurs a pressure difference between the inside and outside of the first hollow fiber type separation membrane 26a, so that only nitrogen gas molecules pass out through the membrane 26a, which are then dissolved in the pure water. Further, since evacuation is performed in the second gas inlet/outlet parts 30a and 30b, the inside of the second hollow fiber type separation membrane 26b is under reduced pressure. Due to a pressure difference between the inside and outside of the second hollow fiber type separation membrane 26b, the dissolved gas molecules in the pure water and the gaseous constituent of moisture pass in through the membrane 26b, which are then degassed.

As the result, the pure water, the nitrogen gas concentration of which is changed by the nitrogen gas dissolution and degassing in the body part 25, is delivered from the delivery opening 31 in the direction indicated by arrow AR7.

Further, the pure water adjusting part 1 has a control part 16 that performs a predetermined control to maintain the nitrogen gas concentration of pure water at a target concentration. The control part 16 is composed of a CPU, ROM, RAM and other memory. A predetermined program is read and executed so that the control part 16 controls the opening and closing of the first and second valves 11 and 15, based on the measured values obtained by the first and second nitrogen concentration meters 6 and 8, and the first and second pressure gauges 9 and 14. This provides pure water having a target nitrogen gas concentration.

The input operation part 17 is, for example, a touch panel or keyboard, through which the operator of the substrate processing apparatus 100 performs a predetermined operation to input a certain instruction. A target concentration of nitrogen gas is also inputted through the input operation part 17. The display part 18 is, for example, a display for displaying the contents of instructions from the operator and the operation circumstances of the substrate processing apparatus 100.

<Control of Nitrogen Gas Concentration>

Following is control of the nitrogen gas concentration of pure water in the pure water adjusting part 1. In the first preferred embodiment, the first nitrogen concentration meter 6 measures sequentially the nitrogen gas concentration of the pure water supplied from the pure water supply source 2, and the second nitrogen concentration meter 8 measures substantially that of the pure water passing through the concentration change part 7. Based on these measured results, the control part 16 effects feedback control of dissolution or degassing of the nitrogen gas in the concentration change part 7. Concretely, the opening and closing of the first valve 11 provided on the nitrogen gas supply path 5 and that of the second valve 15 provided on the nitrogen gas degassing path 13 are objects to be controlled.

The opening and closing of the first valve 11 and second valve 15 are controlled such that, at time τ, there is supplied a nitrogen gas flow F1 passing through the nitrogen gas supply path 5 and a nitrogen gas flow F2 passing through the nitrogen gas degassing path 13, each gas flow satisfying the corresponding relationship expressed by the following expressions:

$$F1(\tau) = f1(\Delta C1, \Delta C2) \quad \text{(Expression 1)}$$

$$F2(\tau) = f2(\Delta C1, \Delta C2) \quad \text{(Expression 2)}$$

where f1 and f2 denote a function determined by the relationship between pressure and dissolved nitrogen gas concentration, the relationship between pressure and flow, or the relationship between pressure and pressure rising time; C1 denotes a first measured value that is a measured value of the nitrogen gas concentration in the first nitrogen concentration meter 6; C2 denotes a second measured value that is a measured value of the nitrogen gas concentration in the second nitrogen concentration meter 8; Ct is a target value of nitrogen gas concentration; $\Delta C1$ is a concentration difference between the target value Ct and the first measured value C1; and $\Delta C2$ is a concentration difference between the target value Ct and the second measured value C2.

Expression 1 is employed when the second measured value C2 is smaller than the target value Ct, i.e., when $\Delta C2<0$. Expression 2 is employed when the second measured value C2 is greater than the target value Ct, i.e., when $\Delta C2>0$. The reason why $\Delta C1$ in Expression 1 and Expression 2 is a variable is that a change in the nitrogen gas concentration of pure water supplied from the pure water supply source 2, i.e., the first measured value C1, results in a corresponding change in the value of $\Delta C1$. It is therefore required that the control part 16 adjusts the first valve 11 in consideration of the change in $\Delta C1$.

FIGS. 4A through 4D are diagrams to explain the relationships between a target value Ct and both first and second measured values C1 and C2, as well as controls to be exercised in response to the relationships. Referring to FIGS. 4A through 4D, the relationships therebetween can roughly be classified into the following four instances:

(a) Ct>C1, and Ct≧C2;

(b) C2>Ct≧C1;

(c) C1>Ct and C2≧Ct; and (d) C1≧Ct>C2

Figure 4A:
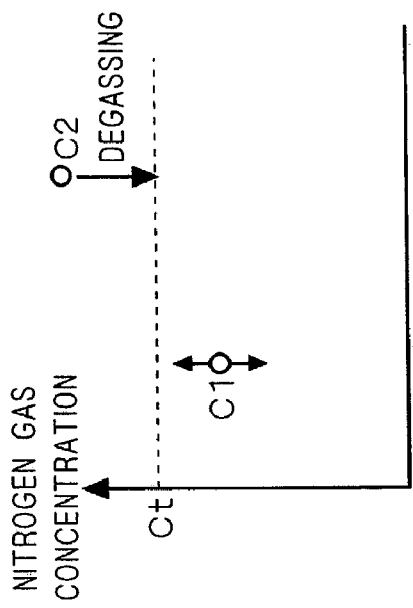
FIGS. 4A through 4D are diagrams to explain the relationships between a target value and both first and second measured values, and controls to be exercised in response to these relationships.

In FIG. 4A, the first and second measured values C1 and C2 are smaller than the target value Ct. This instance requires a further increase in the nitrogen concentration of pure water, and it is controlled such that the second measured value C2 is increased until difference $\Delta C2$ is zero, while satisfying Expression 1. More specifically, while satisfying Expression 1, the control part 16 adjusts the first valve 11 so as to increase the supply pressure of nitrogen gas in the concentration change part 7. This facilitates the dissolution of nitrogen gas in pure water.

Figure 4B:
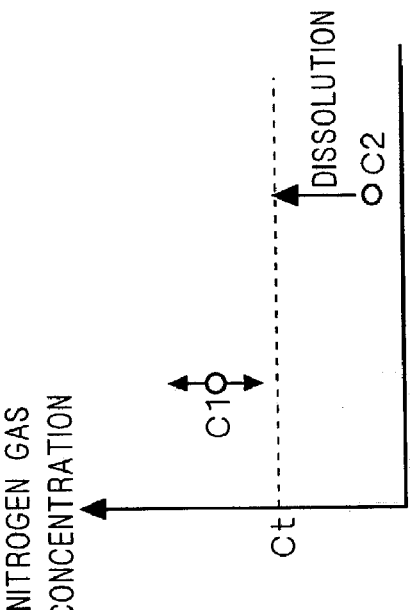

On the other hand, since the measurement of nitrogen gas concentration is made at certain time intervals in accordance with the principle of measurement, as previously described, the transition from the state of FIG. 4A to the state of FIG. 4B that the second measured value C2 overshoots the target value Ct could occur when nitrogen gas dissolution in pure water proceeds satisfactorily in the concentration change part 7, or when the first measured value C1 increases with a factor caused by the pure water supply source 2. In this instance, $\Delta C2>0$, and the control part 16 controls quickly the first and second valves 11 and 15, such that the concentration change part 7 performs degassing process in accordance with Expression 2.

Figure 4C:
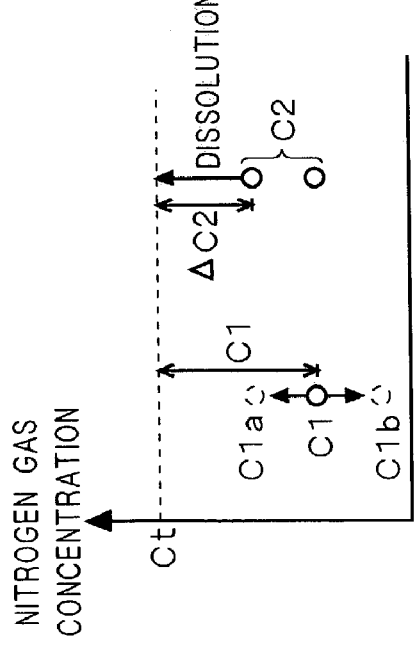

FIG. 4C shows an instance that the first and second measured values C1 and C2 are greater than the target value Ct. This instance requires a decrease in the nitrogen gas concentration in pure water, and it is controlled such that the second measured value C2 is decreased until difference $\Delta C2$ is zero, while satisfying Expression 2. More specifically, while satisfying Expression 2, the control part 16 adjusts the second valve 15 in order to facilitate the degassing of nitrogen gas from pure water.

Figure 4D:
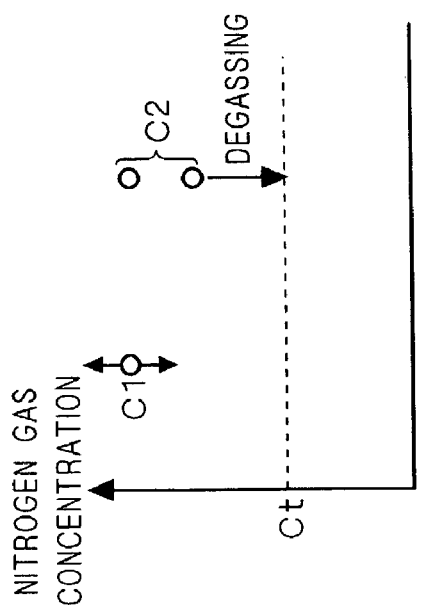

FIG. 4D shows an instance that from the state of FIG. 4C, the second measured value C2 overshoots the target value Ct. In this instance, $\Delta C2<0$, and the control part 16 controls quickly the first and second valves 11 and 15, such that the concentration change part 7 performs dissolving process in accordance with Expression 1.

In the first preferred embodiment, through the foregoing controls, the nitrogen gas concentration of pure water to be supplied to the processing part 19 can be maintained at a predetermined target concentration.

Second Preferred Embodiment

Although in the first preferred embodiment a single concentration change part 7 functions to dissolve nitrogen gas in pure water and degas it from pure water, it is possible to employ other aspect for maintaining the nitrogen gas concentration of pure water at a predetermined target concentration. A second preferred embodiment of the present invention relates to one aspect that independent processing parts perform dissolution and degassing processes, respectively.

<Overall Configuration>

Figure 5:
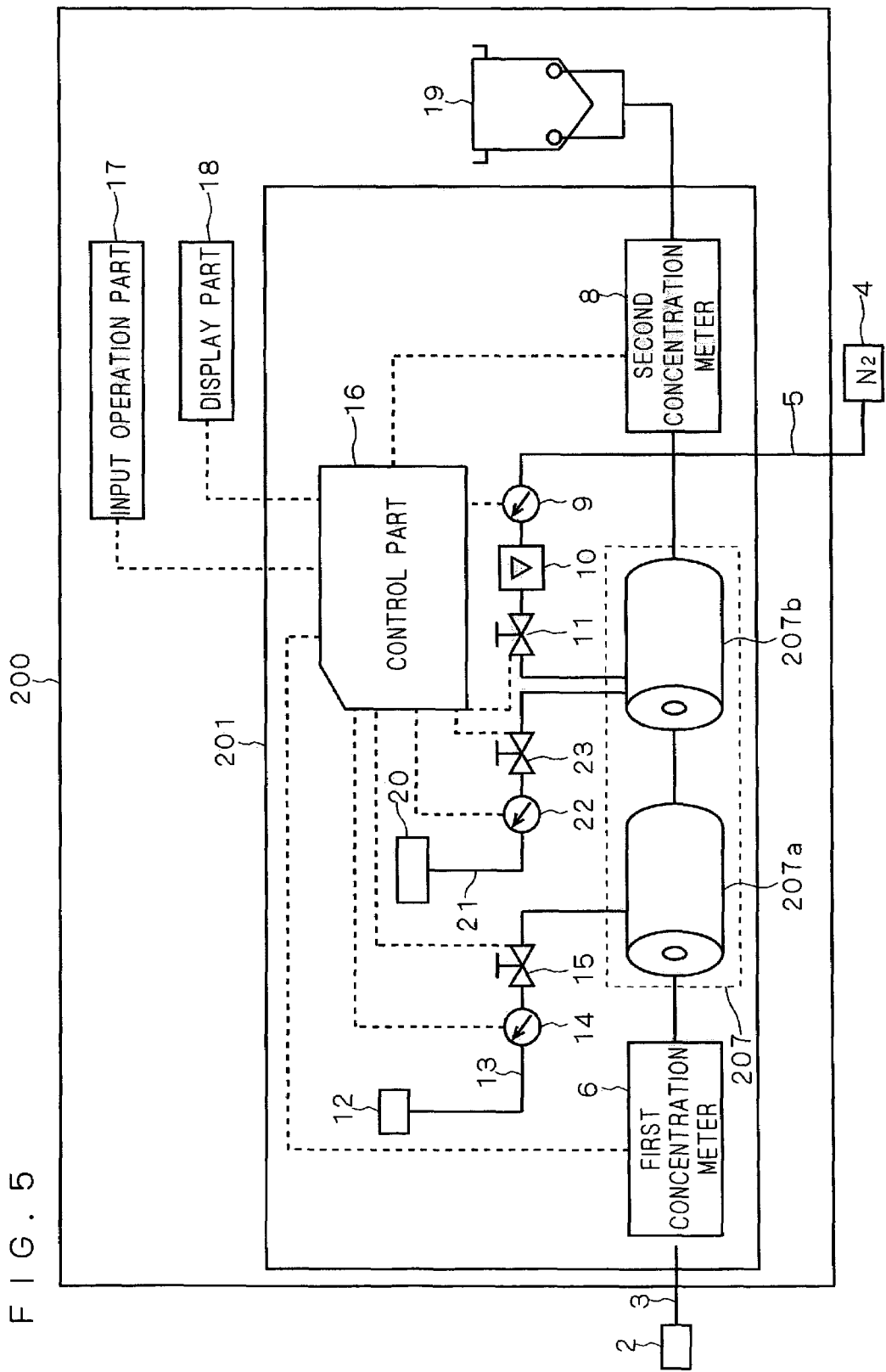
FIG. 5 is a diagram showing a substrate processing apparatus according to a second preferred embodiment of the present invention.

FIG. 5 is a diagram showing a substrate processing apparatus 200 according to the second preferred embodiment. Most of the components constituting the apparatus 200 are common to those in the substrate processing apparatus 100 of the first preferred embodiment. These components bear the same reference numerals and their descriptions are omitted here. The substrate processing apparatus 200 comprises mainly a pure water adjusting part 201, an input operation part 17, a display part 18, and a processing part 19.

Like the pure water adjusting part 1 of the first preferred embodiment, the pure water adjusting part 201 adjusts the nitrogen gas concentration of pure water to a predetermined concentration by dissolving nitrogen gas that is supplied via a nitrogen gas supply path 5 from a nitrogen gas supply source 4 provided as a factory's utility and the like, in pure water that is supplied via a pure water supply path 3 from a pure water supply source 2 provided as a factory's utility and the like. The pure water adjusting part 201 then supplies the adjusted pure water to the processing part 19.

Like the pure water adjusting part 1, the pure water adjusting part 201 comprises mainly a first nitrogen concentration meter 6, a concentration change part 207, and a second nitrogen concentration meter 8. However, the concentration change part 207 is different from the concentration change part 7 in the following point.

The concentration change part 207 has a degassing part 207a that exercises only degassing of nitrogen gas from pure water, and a dissolving part 207b that exercises only dissolution of nitrogen gas in pure water. The degassing part 207a and dissolving part 207b are disposed in series on a pure water supply path 3, such that these parts 207a and 207b are arranged on the upstream side and downstream side, respectively. The degassing part 207a is connected via a nitrogen gas degassing path 13 to a vacuum pump 12, and a second presser gauge 14 and a second valve 15 that can adjust the degree of vacuum are provided on the path 13. The dissolving part 207b is connected via a nitrogen gas supply path 5 to the nitrogen gas supply source 4, and a first pressure gauge 9, a flow meter 10 and a first valve 11 are provided on the path 5. The dissolving part 207b is also connected via a nitrogen gas degassing path 21 to a vacuum pump 20. A third pressure gauge 22 and a third valve 23 that can adjust the degree of vacuum are provided on the path 21.

The configurations of the degassing part 207a and dissolving part 207b are basically the same as the configuration of the concentration change part 7 of the first preferred embodiment shown in FIG. 3. Although their detail descriptions are omitted here, the following point is different from the concentration change part 7. That is, in the degassing part 207a, degassing is carried out in both of first and second gas inlet/outlet parts 29 and 30. In the dissolving part 207b, dissolution is carried out in each of first gas inlet/outlet parts 29a, 29b and second gas inlet/outlet parts 30a, 30b.

The control part 16, input operation part 17, and display part 18 are the same as the first preferred embodiment.

<Control of Nitrogen Gas Concentration>

Following is control of the nitrogen gas concentration of pure water in the second preferred embodiment. Likewise, the first nitrogen concentration meter 6 measures sequentially the nitrogen gas concentration of pure water supplied from the pure water supply source 2, and the second nitrogen concentration meter 8 measures sequentially that of the pure water passing through the concentration change part 207. Based on these measured results, the control part 16 effects feedback controls of the degassing of nitrogen gas in the degassing part 207a and the dissolution of nitrogen gas in the dissolving part 207b. Concretely, the opening and closing of the first valve 11 provided on the nitrogen gas supply path 5 and that of the second valve 15 provided on the nitrogen gas degassing path 13 are objects to be controlled.

Like the first preferred embodiment, the opening and closing of the first valve 11 and second valve 15 are controlled such that, at time τ, there is supplied a nitrogen gas flow F3 passing through the nitrogen gas supply path 5 and a nitrogen gas flow F4 passing through the nitrogen gas degassing path 13, each gas flow satisfying the corresponding relationship expressed by the following expressions:

$$F3(\tau)=g1(\Delta C1, \Delta C2) \quad \text{(Expression 3)}$$

$$F4(\tau)=g2(\Delta C1, \Delta C2) \quad \text{(Expression 4)}$$

where g1 and g2 denote a function determined in the same manner as in the above-mentioned functions f1 and f2; C1 denotes a first measured value; C2 denotes a second measured value; Ct is a target value of nitrogen gas concentration; $\Delta C1$ is a concentration difference between the target value Ct and the first measured value C1; and $\Delta C2$ is a concentration difference between the target value Ct and the second measured value C2.

Thus in the second preferred embodiment, the degassing and dissolution can be performed in the degassing part 207a and dissolving part 207b, respectively, in accordance with the relationship between the target value Ct and both first and second measured values C1 and C2, as in the first preferred embodiment described with reference to FIGS. 4A through 4D.

Figure 6:
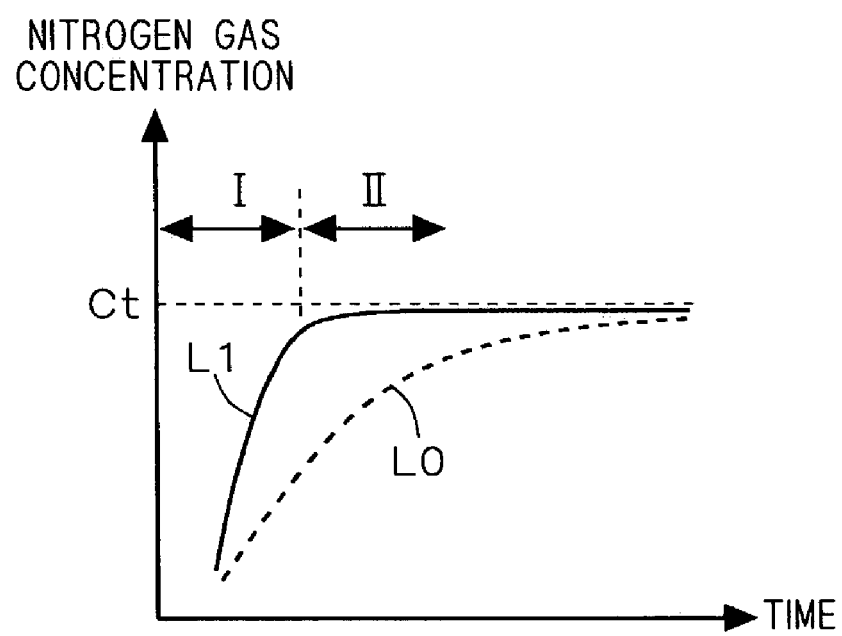
FIG. 6 is a diagram to explain one particular case where a degassing part and dissolving part function concurrently.

Further, since the degassing part 207a and dissolving part 207b are provided individually in the second preferred embodiment, the second measured value C2 can be approached the target value Ct while these parts 207a and 207b are allowed to function concurrently. This is illustrated in FIG. 6, in which curves L0 and L1 represent a change in second measured value C2 with time when the value C2 is approached the target value Ct while increasing the nitrogen gas concentration. Curve L0 corresponds to the case of performing only the process of dissolving nitrogen gas in the dissolving part 207b. On the other hand, curve L1 corresponds to the case of performing only the process of dissolving nitrogen gas in the dissolving part 207b during section I, and the process of degassing in the degassing part 207a is performed jointly during section II. The latter case has a sharper change and reaches the target value Ct faster than the former case. The former case might cause an overshoot when the dissolution proceeds rapidly. In contrast, the latter case combing the degassing process achieves a rapid larger change in the rate of dissolution of nitrogen gas, so that the nitrogen gas concentration approaches the target value Ct quickly. Thus, the combination of the dissolution process and degassing process permits a more complicated control of nitrogen gas concentration.

Alternatively, since the degassing part 207a is disposed on the upstream side in the second preferred embodiment, it is possible to configure as follows. The nitrogen gas of pure water supplied from the pure water supply source 2 is sufficiently degassed up to a degassing limit, and the resulting pure water is then supplied to the dissolving part 207b for dissolving nitrogen gas toward the target value Ct. This configuration simplifies not only the control related to the degassing part 207a but also the control related to the dissolving part 207b because it is possible to cancel a change in the first measured value C1 caused by the pure water supply source 2.

<Modifications to First and Second Preferred Embodiments>

Figure 7:
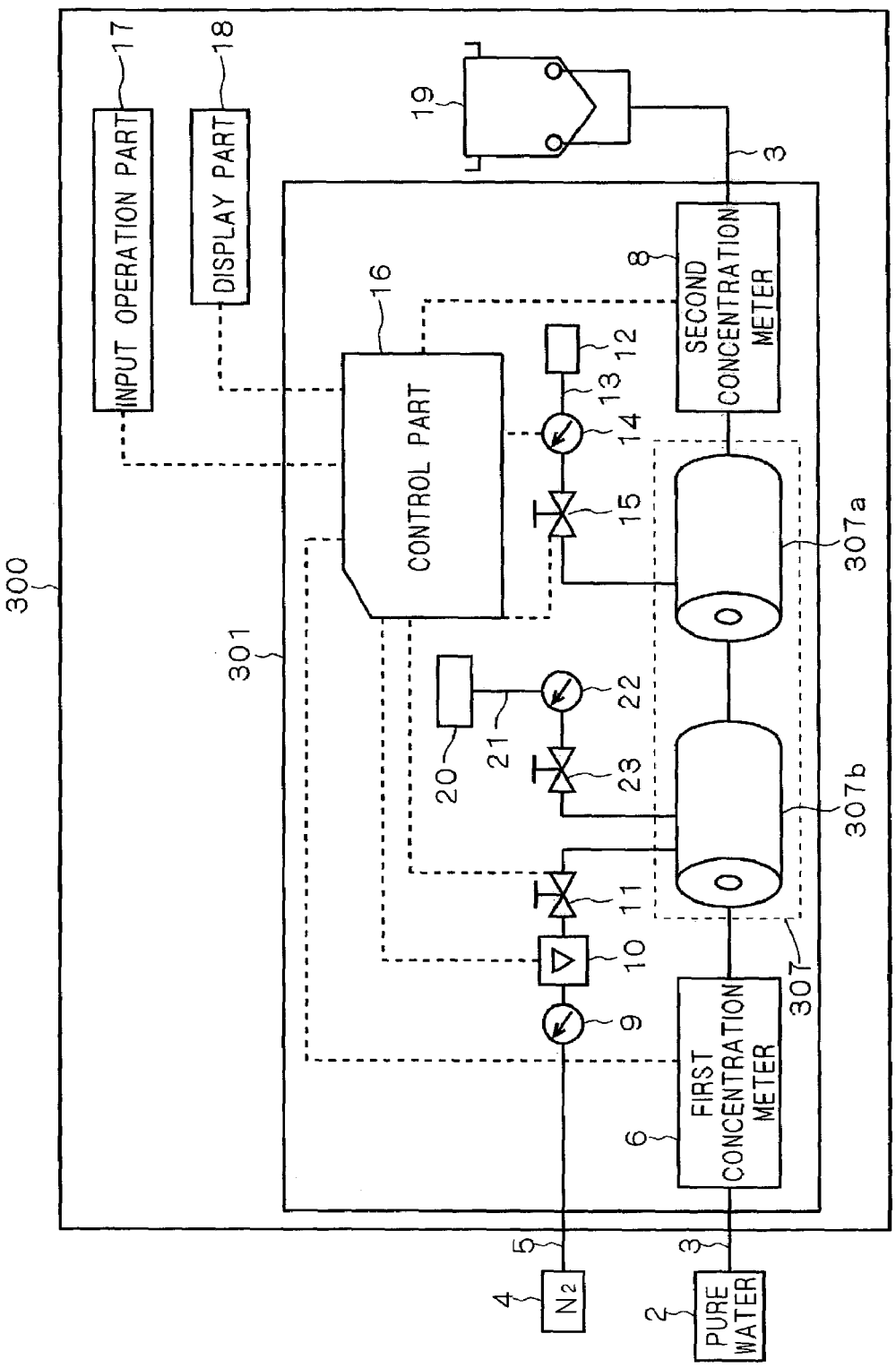
FIG. 7 is a diagram showing the configuration of other substrate processing apparatus.

In the second preferred embodiment the degassing part 207a and dissolving part 207b are disposed on the upstream and downstream sides, respectively. Even when these parts are disposed vice versa, similar effects are obtainable except for the following point. FIG. 7 shows the configuration of a substrate processing apparatus 300 that corresponds to this alternative. That is, in the apparatus 300, a dissolving part 207b is disposed on the upstream side and a degassing part 207a is disposed on the downstream side in a concentration change part 307 of a pure water adjusting part 301. Although this configuration does not provide the effect of canceling a change in the first measured value C1, other controls are attainable as in the first and second preferred embodiments.

In the first and second preferred embodiments, the substrate processing apparatus may be configured as an apparatus arranged in a single casing. In other alternative, the processing part and pure water adjusting part may be configured as a separate and independent apparatus. In a still other alternative, both of the input operation part and display part, or these parts and the control part of the pure water adjusting part may be implemented by a general purpose computer.

Alternatively, the processing part 19 is disposed in a first unit and the pure water adjusting part 1 (201, 301) is disposed in a second unit, so that the pure water supply path 3 effects the supply of pure water from the second unit to the first unit.

Third Preferred Embodiment

In the first and second preferred embodiments, the dissolution of nitrogen gas in pure water and the degassing of nitrogen gas from pure water are carried out by adjusting the flow of nitrogen gas based on the measured results obtained in the first and second concentration meters. It is possible to employ other aspect for maintaining the concentration of nitrogen gas in pure water at a predetermined target value. A third preferred embodiment of the present invention describes one aspect that the concentration of nitrogen gas is adjusted by adjusting the pressure of nitrogen gas supplied.

<Overall Configuration>

Figure 8:
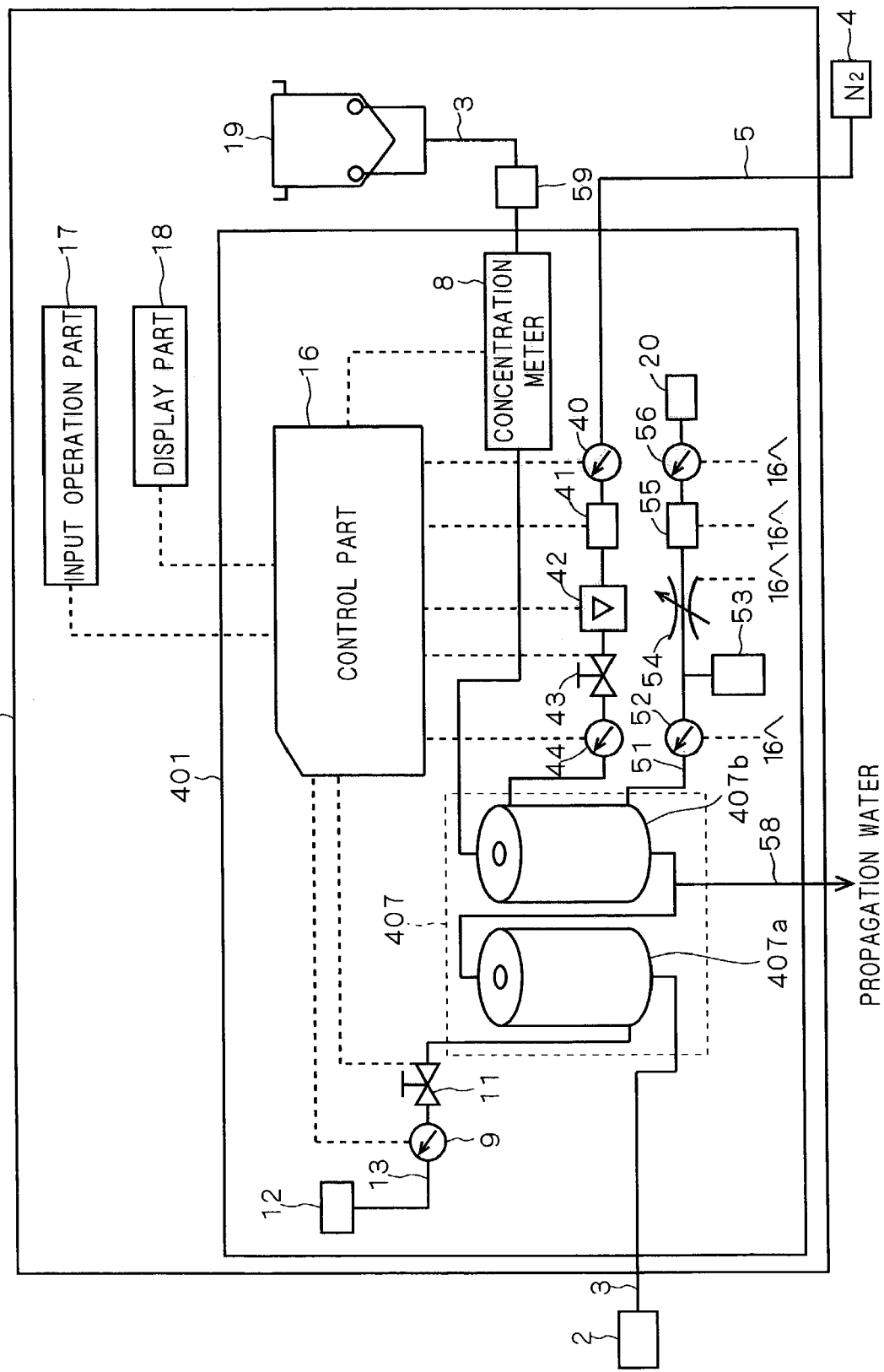
FIG. 8 is a substrate processing apparatus according to a third preferred embodiment of the present invention.

FIG. 8 is a diagram showing a substrate processing apparatus 400 according to the third preferred embodiment. Most of the components constituting the apparatus 400 are common to those in the substrate processing apparatus 200 of the second preferred embodiment. These components bear the same reference numerals. The substrate processing apparatus 400 comprises mainly a pure water adjusting part 401, an input operation part 17, a display part 18, a pure water heating part 59, and a processing part 19.

The pure water adjusting part 401 adjusts the nitrogen gas concentration of pure water to a predetermined concentration by dissolving nitrogen gas that is supplied via a nitrogen gas supply path 5 from a nitrogen gas supply source 4 provided as a factory's utility and the like, in pure water that is supplied via a pure water supply path 3 (corresponding to a processing liquid supply path) from a pure water supply source 2 provided as a factory's utility and the like. The pure water adjusting part 401 then supplies the adjusted pure water to the pure water heating part 59 heating the pure water and the processing part 19 performing a predetermined process of the pure water.

The pure water adjusting part 401 comprises mainly a concentration adjusting part 407 and a concentration meter 8 (corresponding to a concentration measuring means). The concentration adjusting part 407 has a degassing part 407a and a dissolving part 407b. The degassing part 407a and dissolving part 407b are disposed in series on a pure water supply path 3 such that these parts 407a and 407b are arranged on the upstream side and downstream side, respectively. Disposed between the degassing part 407a and dissolving part 407b is a propagating water flow-through path 58 that branches from the pure water supply path 3 so as to extract propagating water.

An exhaust opening 75 (to be described later) of the degassing part 407a is connected via a nitrogen gas degassing path 13 to a vacuum pump 12 that can perform evacuation for degassing nitrogen gas from the concentration adjusting part 407 through the nitrogen gas degassing path 13. Disposed on the path 13 are a pressure gauge 9 for measuring the pressure of nitrogen gas exhausted and a valve 11 that can adjust the degree of vacuum.

An air supply opening 74 (to be described later) of the dissolving part 407b is connected via a nitrogen gas supply path 5 to a nitrogen gas supply source 4. Disposed on the path 5 are, in the order from the nitrogen gas supply source 4 side, a first pressure gauge 40 for measuring the pressure of nitrogen gas supplied from the nitrogen gas supply source 4, a first regulator 41 (corresponding to gas pressure change means, upstream pressure change means, or upstream flow change means) which adjusts the pressure of nitrogen gas supplied to the dissolving part 407b to a target value, a flow meter 42 with needle for measuring the flow of nitrogen gas per unit time (hereinafter referred to simply as "flow"), a first valve 43 for opening and closing the nitrogen gas supply path 5, and a second pressure gauge 44 (corresponding to gas pressure measuring means) which monitors the pressure of nitrogen gas immediately before being supplied to the dissolving part 407b. The flow meter 42 may be replaced with a mass flow controller.

An exhaust opening 75 (to be described later) of the dissolving part 407b is connected via a nitrogen gas exhaust path 51 to a vacuum pump 20. Disposed on the path 51 are, in the order from the dissolving part 407b side, a third pressure gauge 52 (corresponding to gas pressure measuring means or downstream pressure measuring means) which monitors the pressure immediately after passing through the dissolving part 407b, a mist trap 53 for trapping mist in nitrogen gas exhausted (corresponding to mist trapping means), an orifice 54 with the function of adjusting a needle for vacuum pressure which makes fine adjustment of the exhaust pressure of nitrogen gas (corresponding to gas pressure change means, downstream pressure change means, or downstream flow change means), a second regulator 55 for adjusting the exhaust pressure of nitrogen gas, and a fourth pressure gauge 56 that is disposed at a suction opening (not shown) of the vacuum pump 20 and monitors whether its operation is normal or not. Hereat, the third pressure gauge 52 can measure both of positive pressure and negative pressure relative to atmospheric pressure, and the fourth pressure gauge 56 can measure a negative pressure relative to atmospheric pressure.

Figure 9:
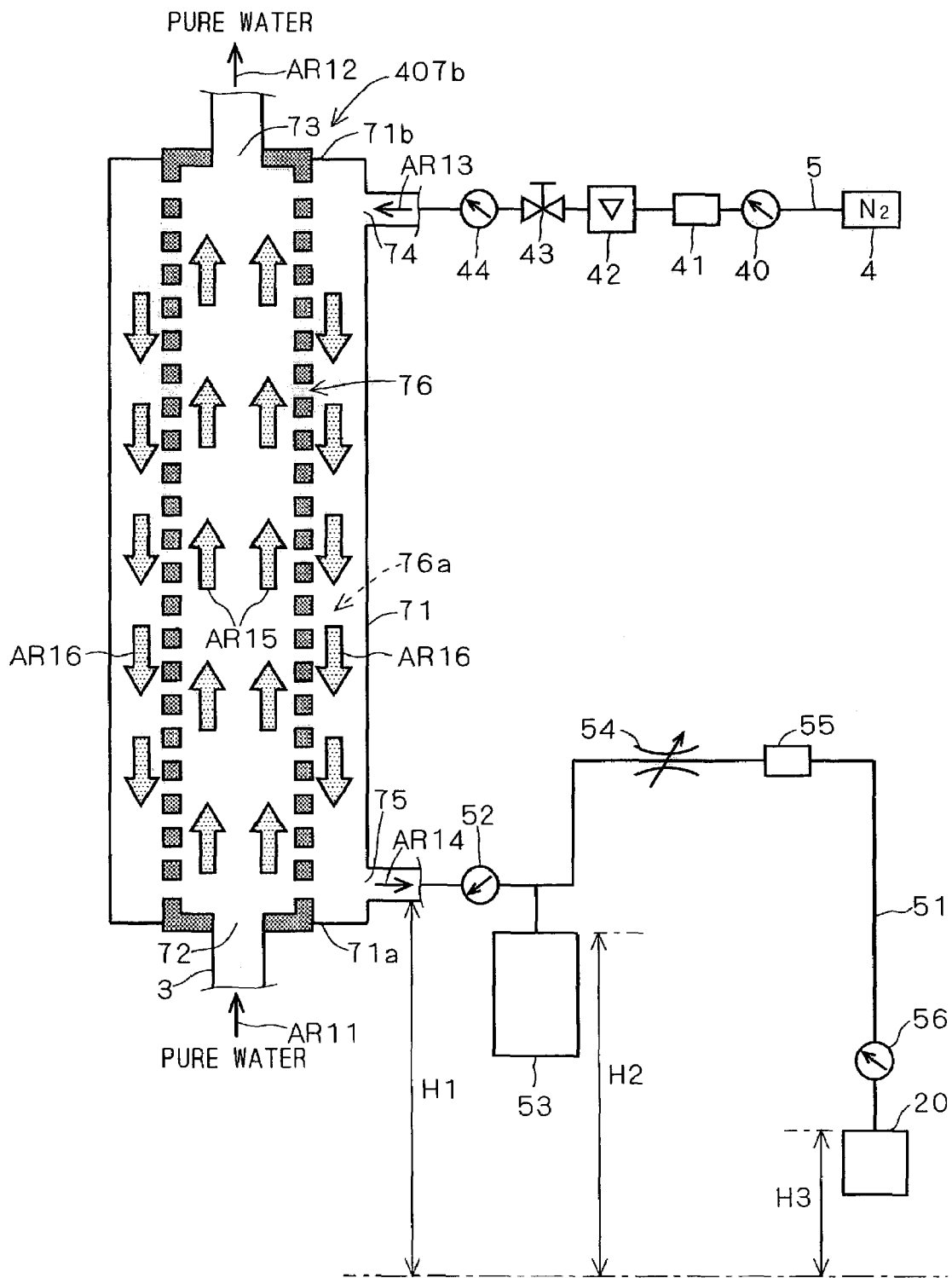
FIG. 9 is a diagram showing schematically a rough configuration of a dissolving part and arrangement of individual parts connected to the dissolving part.

FIG. 9 shows the outline configuration of the dissolving part 407b and the arrangement of individual parts connected thereto. Referring to FIG. 9, the dissolving part 407b comprises mainly (i) a body part 71 that exercises concentration adjusting process of dissolving gas in pure water; (ii) an intake opening 72 that is disposed at a first end part 71a of the body part 71 and intakes pure water supplied from the pure water supply path (FIG. 8) in the direction indicated by arrow AR11; (iii) a delivery opening 73 that is disposed at a second end part 71b of the body part 71 and delivers pure water after being subjected to concentration adjusting process in the direction indicated by arrow AR12; (iv) an air supply opening 74 that is disposed on a side surface in the vicinity of the second end part 71b and can supply gas; and (v) an exhaust opening 75 that is disposed on a side surface in the vicinity of the first end part 71a and can effect evacuation independently from the supply of gas from the air supply opening 74. The dissolving part 407b is mounted such that its longitudinal direction is in the vertical direction, with the first end part 71a on its lower side and the second end part 71b on its upper side. Nitrogen gas is supplied under pressure from the air supply opening 74 in the direction indicated by arrow AR13, and then evacuated from the exhaust opening 75 in the direction indicated by arrow AR14.

Coaxially within the cylindrical body part 71 is mounted a cylindrical water supply pipe 76 which is finer than the body part 71 and connected to the intake opening 72 and delivery opening 73 so as to supply pure water in the direction indicated by arrow AR15. Disposed on the side surface of the water supply pipe 76 is a dissolving membrane 76a made of a hollow fiber type separation membrane having gas permeability and liquid impermeability, through which nitrogen gas can pass but pure water cannot pass as it is. A hollow air supply path is formed between the water supply pipe 76 and body part 71. As indicated by arrow AR16, the direction in which nitrogen gas is supplied is opposed to the direction in which water is supplied (AR15), with the dissolving membrane 76a interposed therebetween. The dissolving membrane 76a and the space of the air supply path connected to the membrane 76a correspond to the gas dissolving part of the present invention. A group of that space, the nitrogen gas supply path 5 and nitrogen gas exhaust path 51 correspond to the gas path of the present invention.

With the third preferred embodiment in which nitrogen gas is supplied under pressure from the air supply opening 74 whereas evacuation is conducted through the exhaust opening 75, as previously described, the pressure of the gaseous phase in the body part 71 can be controlled to be a negative or positive pressure relative to atmospheric pressure by striking a balance between the charge rate of nitrogen gas and the discharge rate of nitrogen gas. That is, striking a balance between the charge and discharge of nitrogen gas realizes pressure control of the inside of the dissolving part 407b as if it were a closed system (i.e., gas pressure control by semi-closed-system).

Under a positive pressure, when the inside of the water supply pipe 76 is filled with pure water supplied from the intake opening 72, there occurs a pressure difference between the inside and outside of the dissolving membrane 76a, so that only nitrogen gas molecules pass in through the dissolving membrane 76a, which are then dissolved in the pure water. In contrast, under a negative pressure, due to a pressure difference between the inside and outside of the dissolving membrane 76a, the dissolved gas molecules in pure water pass out through the dissolving membrane 76a, which are then degassed.

The degassing part 407a has completely the same configuration as the dissolving part 407b. It is however noted that the part serving as the air supply opening 74 in the dissolving part 407b is also connected, like the exhaust opening 75, to the nitrogen gas degassing path 13 so as to effect only evacuation. Therefore, during the period of time of evacuation, the inside of the body part 71 is always in a negative pressure. When the inside of the water supply pipe 76 is filled with pure water supplied from the intake opening 72, degassing process is always performed by a pressure difference between the inside and outside of the dissolving membrane 76a.

Thus, the pure water that has been subjected to degassing in the body part 71 of the degassing part 407a passes, in the direction indicated by arrow AR11, through the intake opening 72 to the body part 71 of the dissolving part 407b, at which dissolution or degassing of nitrogen gas is performed to adjust the pure water to a predetermined nitrogen concentration. The pure water so adjusted is then delivered through the delivery opening 73 in the direction indicated by arrow AR12.

Referring again to FIG. 9, on the nitrogen gas exhaust path 51 extending from the dissolving part 407b in the substrate processing apparatus 400, a location height H1 of the exhaust opening 75 of the dissolving part 407b, a location height H2 of the air supply opening (not shown) of the mist trap 53, and a location height H3 of the suction opening of the vacuum pump 20 (For example, these location heights are the height of the respective parts from the floor face) are arranged in descending order, that is, so as to satisfy the following Expression 5:

$$H1>H2>H3, \text{ or } H1>H3>H2 \quad \text{(Expression 5)}$$

A concentration meter 8 disposed in line on the pure water supply path 3 measures the nitrogen concentration of pure water at certain time intervals. Its configuration is the same as that of the first and second nitrogen concentration meters 6 and 8 in the first preferred embodiment.

The pure water adjusting part 401 further comprises a control part 16 (corresponding to concentration control means) that exercises a predetermined control for maintaining the nitrogen gas concentration of pure water at a target value. The control part 16 is configured by a CPU, ROM, RAM and other memory (which are not shown), and is connected via a communication line to an input operation part 17, concentration meter 8, pressure gauge 9, first pressure gauge 40, flow meter 42, second pressure gauge 44, third pressure gauge 52, and fourth pressure gauge 56, respectively. The control part 16 can receive signals from these components. The control part 16 is also connected via a communication line to a display part 18, valve 11, first regulator 41, first valve 43, orifice 54, and second regulator 55, respectively, in order to control their respective operations. Particularly, by reading and executing a predetermined program, the control part 16 controls the opening and closing of the first regulator 41 based on a measured value obtained by the second pressure gauge 44, and controls the opening and closing of the orifice 54 based on a measured value obtained by the third pressure gauge 52, so that, in the substrate processing apparatus 400, pure water having a target nitrogen gas concentration comes available on the dissolving part 407b.

The input operation part 17 is, for example, a touch panel or keyboard, through which the operator of the substrate processing apparatus 400 performs a predetermined operation to input a certain instruction. A target concentration of nitrogen gas is also inputted through the input operation part 17.

The display part 18 is, for example, a display for displaying the contents of instructions from the operator and the operation circumstances of the substrate processing apparatus 400.

<Control of Nitrogen Gas Concentration>

Following is control of nitrogen gas concentration of pure water in the third preferred embodiment wherein a target nitrogen gas concentration of pure water (i.e., target concentration) is attained by maintaining a target pressure corresponding to the target concentration in the dissolving part 407b. Its control procedure and principle will be described below.

First, an operator inputs and sets a target concentration then instructs a start of process through the input operation part 17, while viewing a display of the display part 18.

A signal of the target concentration so set is sent to the control part 16. On receipt of this, the control part 16 finds a target pressure.

Figure 10:
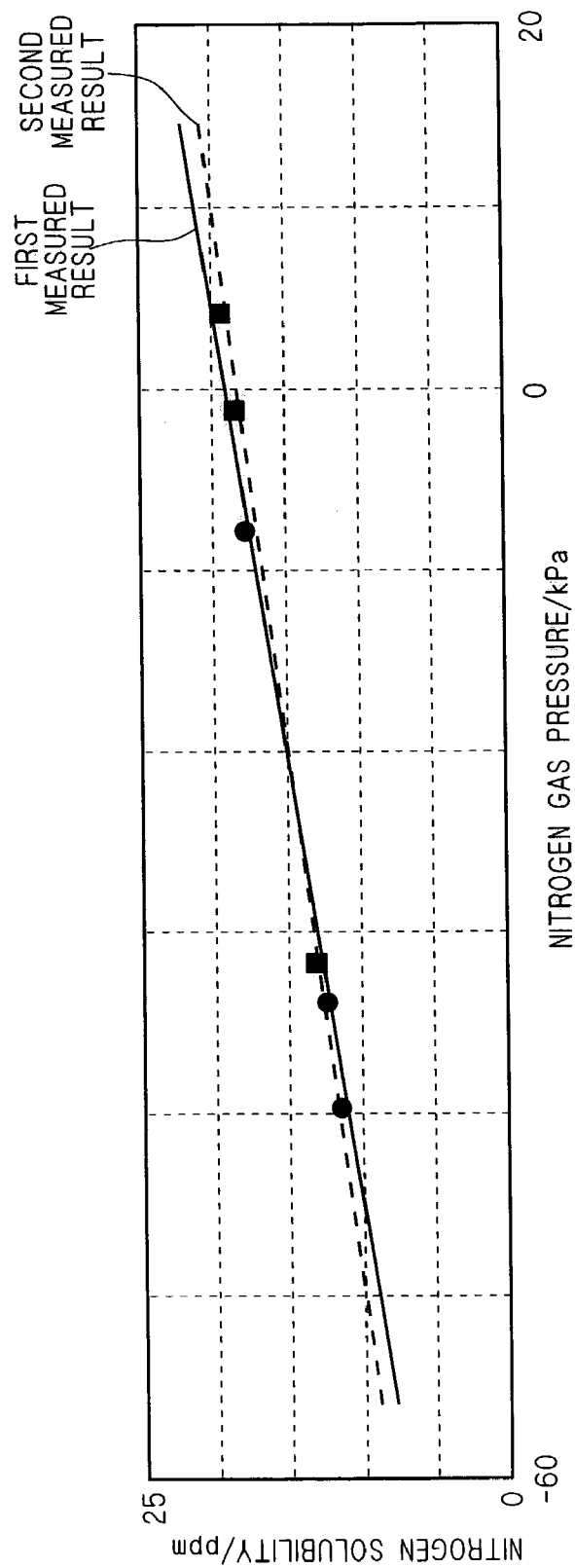
FIG. 10 is a graph showing the relationship between the exhaust pressure of nitrogen gas and the concentration of dissolved nitrogen in pure water in the dissolving part.

FIG. 10 is a graph showing the relationship between the exhaust pressure of nitrogen gas (a difference value relative to atmospheric pressure) and the concentration of dissolved nitrogen gas in pure water in the dissolving part 407b. FIG. 10 plots first and second measured results that were obtained at different times. As shown in FIG. 10, it can be said that there is generally an approximate proportionality between the pressure of nitrogen gas and the concentration of dissolved nitrogen gas in the pure water that has come into contact with the nitrogen gas. That is, the relationship between pressure X of nitrogen gas and concentration Y of dissolved nitrogen gas in pure water can be expressed by the following linear function in Expression 6:

$$Y=aX+b \quad \text{(Expression 6)}$$

where a and b are constants.

Accordingly, in the substrate processing apparatus 400 of the third preferred embodiment, the individual parts are controlled such that the pressure of nitrogen gas in the dissolving part 407b, more specifically, a pressure value (exhaust pressure) measured by the third pressure gauge 52 located in the vicinity of the exhaust opening 75 of the dissolving part 407b is maintained at a target pressure. In practice, constants a and b are previously found by tests or the like and these constants are stored in the ROM of the control part 16. At the time of actual control, the control part 16 reads the constants a and b, and substitutes them in Y of Expression 6 to obtain a value of X, which is then temporarily stored in the RAM as a target pressure in the third pressure gauge 52. When the measured value in the third pressure gauge 52 is lower than the target pressure, it is controlled such that the degree of opening of the orifice 54 is increased to increase the flow. In contrast, when the measured value is higher than the target pressure, it is controlled such that the degree of opening of the first regulator 41 is decreased to decrease the flow.

Figure 11:
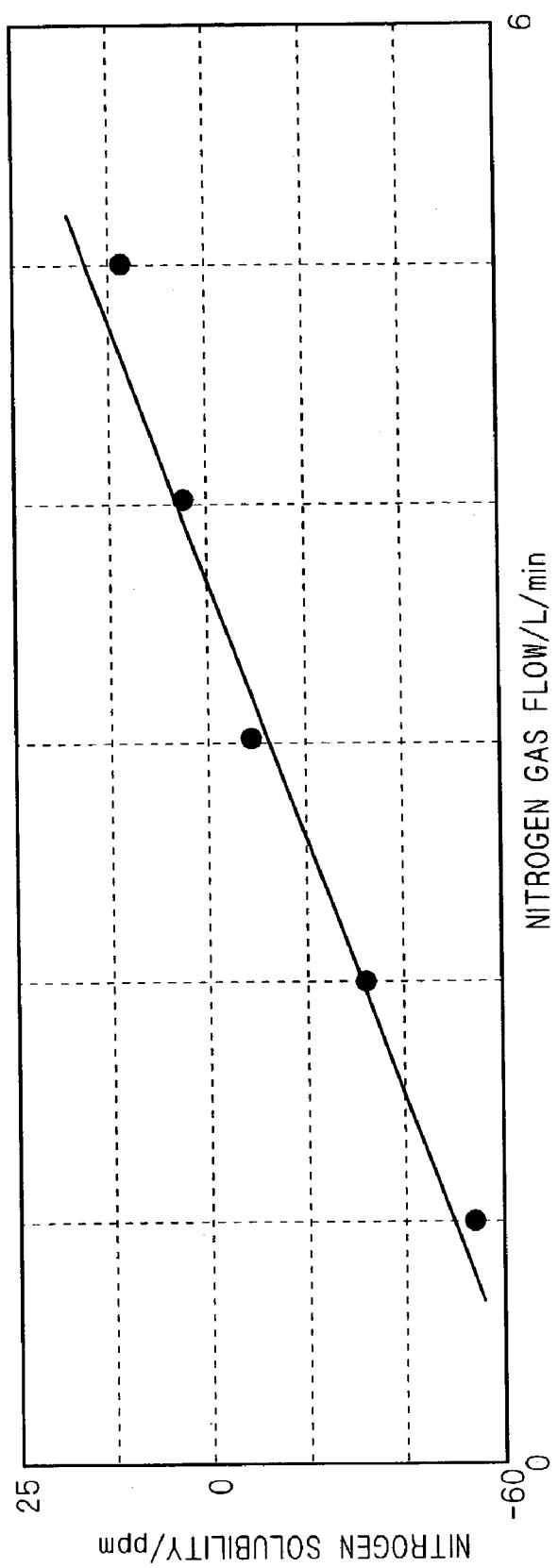
FIG. 11 is a graph showing the relationship between the flow of nitrogen gas and the nitrogen gas pressure in the dissolving part.

Subsequently, based on the target pressure, the control part 16 finds a target supply air pressure in the dissolving part 407b. In order to obtain a target pressure in the dissolving part 407b, a supply air pressure that is the pressure of nitrogen gas supplied is adjusted to a target supply air pressure corresponding to the target pressure. A target supply air pressure is determined uniquely when a target pressure is determined. Therefore, a correspondence table indicating such correspondence is previously prepared by test or the like, and then stored in the ROM. At the time of actual process, referring to this correspondence table, a supply air pressure corresponding to the target pressure and target concentration is found as a target supply air pressure. FIG. 11 is a graph showing the relationship between the flow of nitrogen gas and the pressure of nitrogen gas in the dissolving part 407b (a difference value from atmospheric pressure). Referring to FIG. 11, there is also proportionality between the flow of nitrogen gas and the pressure of nitrogen gas in the dissolving part 407b. In the actual control, when the measured value of the second pressure gauge 44 is lower than the target supply air pressure, it is controlled such that the degree of opening of a valve (not shown) of the first regulator 41 is increased to increase the flow. In contrast, when the measured value is higher than the target supply air pressure, it is controlled such that the degree of opening of the valve of the first regulator 41 is decreased to decrease the flow.

Thus, in the third preferred embodiment, the concentration of dissolved nitrogen gas in pure water is adjusted to a target concentration by maintaining the nitrogen gas pressure in the inside of the dissolving part 407b at a predetermined value while striking a balance between an exhaust pressure and supply air pressure.

During the period of time that a substrate to be processed is charged in the processing part 19 and a predetermined substrate process is performed, the first regulator 41 is always subjected to feedback control such that a measured value of the second pressure gauge 44 approaches a target supply air pressure, and the orifice 54 is always subjected to feedback control such that a measured value of the third pressure gauge 52 approaches a target pressure.

Thus, in the third preferred embodiment, the concentration of dissolved nitrogen gas in pure water is adjusted to a target concentration by maintaining the nitrogen gas pressure in the inside of the dissolving part 407b at a predetermined value, while striking a balance between an exhaust pressure and supply air pressure. The pure water so adjusted is supplied during the period of time that the processing part 19 performs substrate process.

Meanwhile, if the supply of pure water is stopped in the intervals between substrate processes, for example, bacteria might occur in the pure water supply path, which adversely affects the subsequent substrate process. In order to suppress such an occurrence, the substrate process apparatus 400 performs such a slow leak that permits a small amount of pure water (about several liters/min) to continue flowing through the pure water supply path 3, without stopping the supply of pure water even in the state of idling. At that time, nitrogen gas is also supplied all the times. This is because if pure water is supplied during idling while the supply of nitrogen gas is stopped, pure water leaks out of the dissolving membrane 76a of the dissolving part 407b so that water droplets seep in the gaseous phase of the dissolving membrane 76a and the exhaust path of nitrogen gas. If water droplets seep there, the effective area of the dissolving membrane 76a is substantially reduced thereby to cause disadvantages such as a drop in the concentration of dissolved nitrogen gas in pure water, and poor reproducibility of the concentration of dissolution when the process is resumed.

Thus, in this apparatus, both of pure water and nitrogen gas are always supplied to the dissolving part 407b even at the time of idling, and control for maintaining the pressure of nitrogen gas at a target pressure is continued even at the time of idling in the intervals between substrate processes. It is noted that since the flow of pure water is small at this time, the nitrogen gas concentration of pure water is not adjusted to a target concentration. However, there is no problem because no substrate process is performed.

Figure 12:
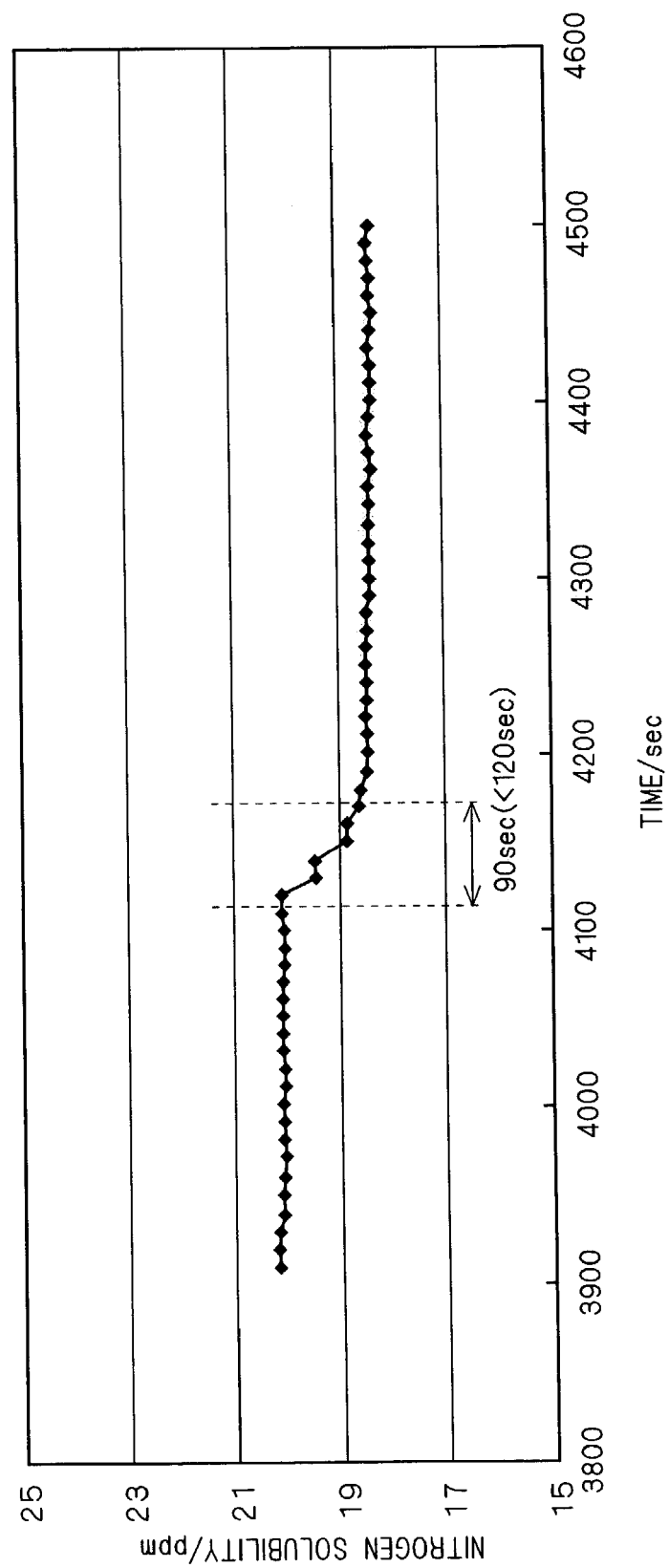
FIG. 12 is a graph showing a situation where the concentration of dissolved nitrogen gas in pure water changes when changing the charge rate of pure water.
Figure 13:
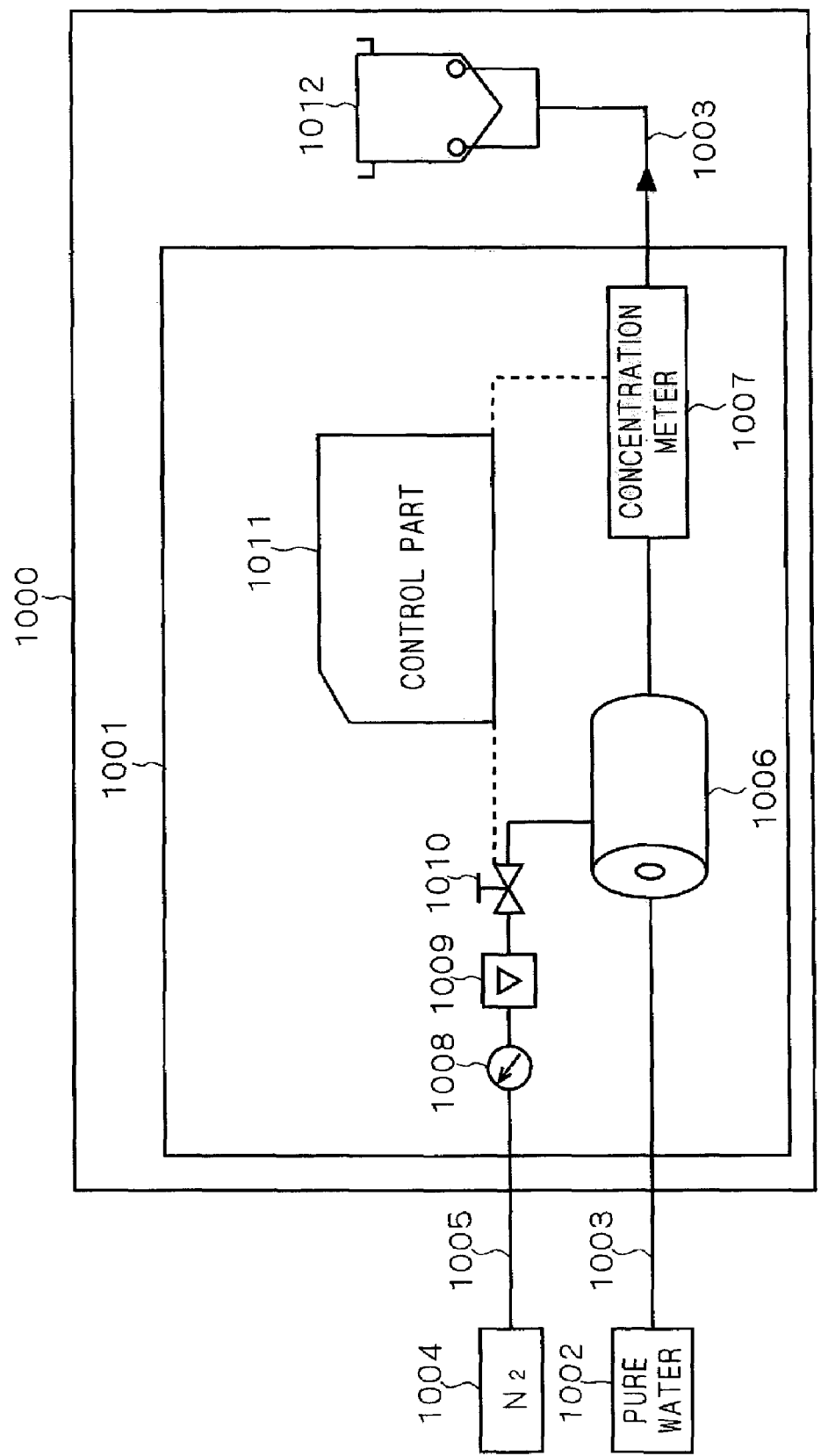
FIG. 13 is a diagram showing a conventional substrate processing apparatus.
Figure 14:
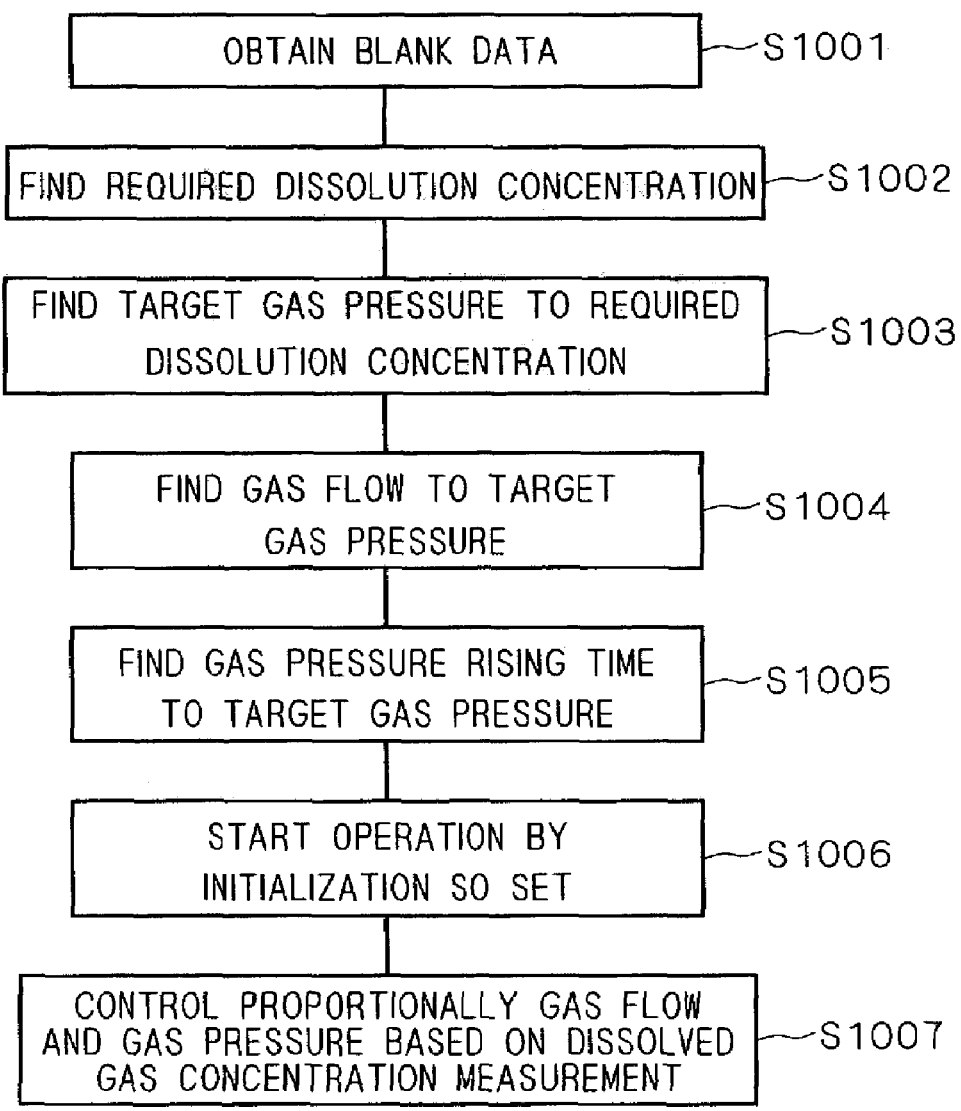
FIG. 14 is a diagram showing a sequence of operating steps for dissolving nitrogen gas in a pure water adjusting part.

FIG. 12 is a graph showing how the concentration of dissolved nitrogen gas in pure water changes when the charge rate of pure water is changed from 3 L/min to 20 L/min. Referring to FIG. 12, at time T, the charge rate of pure water is changed from 3 L/min for slow leak to 20 L/min for substrate process, the concentration of dissolved nitrogen gas in pure water is changed sharply. However, it can be seen that the concentration of dissolved nitrogen gas in pure water is stabilized at the target concentration approximately in 90 seconds, which is shorter than 120 seconds as an allowable maximum stabilizing time. Thus, with the substrate processing apparatus 400 of the third preferred embodiment, even if the charge rate of pure water is returned when the substrate process is resumed from the state of idling, the concentration of dissolved nitrogen gas in pure water returns exactly to its original concentration in a short time, and the reproducibility of the concentration of dissolution is excellent.

Further, the substrate processing apparatus 400 of the third preferred embodiment controls both of the supply pressure of nitrogen gas to the dissolving part 407b and the exhaust pressure. This realizes the supply of nitrogen gas having a higher pressure than atmospheric pressure to the dissolving part 407b, while the charge rate of nitrogen gas from the nitrogen gas supply source remains unchanged. It is therefore possible to manufacture such nitrogen gas dissolved water of high concentration having saturated solubility at ordinary temperature, ranging from 15 ppm to about 20 ppm, which it has been difficult to manufacture under atmospheric pressure. In addition, the nitrogen gas pressure of the dissolving part 407b can also be made into a negative pressure, thereby enabling to manufacture nitrogen gas dissolved water having a lower concentration. This permits a wide concentration range of nitrogen gas dissolved water that can be manufactured and a stable manufacture of nitrogen gas dissolved water from low concentration to high concentration.

Furthermore, in the substrate processing apparatus 400 of the third preferred embodiment, the orifice 54 and second regulator 55 are located closer to the vacuum pump 20 than the mist trap 53, in order to suppress the amount of moisture that reaches the orifice 54 and second regulator 55. This enables to suppress that the flow adjusting function deteriorates due to moisture, and suppress the adverse effect on the control of the concentration of dissolved nitrogen gas in pure water.

<Modifications to Third Preferred Embodiment>

It is possible to employ other substrate processing apparatus and other method of controlling inert gas concentration.

In the third preferred embodiment, a target pressure corresponding to a target concentration is found by function. In an alternative, a pressure-concentration conversion table indicating the relationship between the pressure of nitrogen gas and the concentration of dissolved nitrogen gas in pure water may be stored, for example, in the ROM of the control part 16. This conversion table is used to find a target pressure from a target concentration.

In the third preferred embodiment, the pressure of nitrogen gas is controlled based on the measured result of the third pressure gauge 52. The nitrogen gas pressure may be controlled based on a measured result of nitrogen gas in pure water that is obtained in the concentration meter 8. In this instance, the configuration of the apparatus is approximately the same as the third preferred embodiment, except that only the third pressure meter 52 is unnecessary. Following is a concrete control method.

Like the third preferred embodiment, an operator inputs and sets a target concentration, then instructs a start of process.

On receipt of a signal of the target concentration so set, the control part 16 finds a target pressure. The relationship between the pressure of nitrogen gas and the concentration of dissolved nitrogen gas in pure water, which is used for conversion, may be the linear function in Expression 6 as in the third preferred embodiment, or the pressure-concentration conversion table as described above.

Subsequently, the control part 16 finds a target supply air pressure in the dissolving part 407b based on the target pressure, as in the third preferred embodiment.

During the period of time that a substrate to be processed is charged in the processing part 19 and a predetermined substrate process is performed, the first regulator 41 is always subjected to feedback control such that a measured value of the second pressure gauge 44 approaches the target supply pressure. After finding an exhaust pressure corresponding to a measured concentration value in the concentration meter 8, the orifice 54 is always subjected to feedback control such that the exhaust pressure approaches the target pressure. At that time, the above-mentioned relationship between the pressure of nitrogen gas and the concentration of dissolved nitrogen gas in pure water is used to find the corresponding exhaust pressure from the measured concentration value. It is noted that the control itself of the first regulator 41 and orifice 54 is the same as the third preferred embodiment, except that the measured value serving as a reference of the control of the orifice 54 is not the measured value obtained in the pressure gauge but the measured value in the concentration meter 8.

Although in the third preferred embodiment the dissolving part 407b is mounted vertically such that its longitudinal direction is in the vertical direction, it may be placed horizontally such that its longitudinal direction is in the horizontal direction. In this instance, the air supply opening 74 is also located so as to face to immediately below with respect to the vertical direction. It is arranged such that the direction in which pure water flows is opposite to the direction in which nitrogen gas flows.

In the third preferred embodiment, to control the concentration of dissolved nitrogen gas in pure water, the exhaust pressure from the exhaust opening 75 is controlled so as to be equal to a target pressure. In an alternative, the measuring location of pressure used as a pressure control reference may be any other location on the gas path. For example, in a gas flow-through space between the body part 71 and dissolving membrane 76a in the dissolving part 407b, another pressure gauge may be added to control such that the pressure in the gaseous phase of the dissolving part matches a target pressure.

<Modifications to First to Third Preferred Embodiments>

Although the foregoing preferred embodiments employ nitrogen gas as an inert gas to be dissolved in pure water, these embodiment are applicable to any type of gas such as rare gas (e.g., xenon (Xe)), carbon dioxide and methane gas. Although pure water is employed as a processing liquid, other processing liquid is also applicable.

In the second or third preferred embodiment, the pure water degassed by the degassing part 207a or 407a is supplied to the dissolving part 207a or 407b. In an alternative, the degassing part may be omitted by configuring so as to supply pure water that has been degassed in the pure water supply source 2.

The process performed by the processing part 19 in every preferred embodiment is applicable to any type of process such as washing process and developing process, which performs a predetermined process to a substrate with the use of a processing liquid. It is also applicable to any type of processing form such as batch processing and single-wafer type substrate processing.

While the invention has been shown and described in detail, the foregoing description is in all aspects illustrative and not restrictive. It is therefore understood that numerous modifications and variations can be devised without departing from the scope of the invention.

What is claimed is:

1. A substrate processing apparatus comprising:
   (a) a processing part for performing a predetermined process of a substrate with a processing liquid;
   (b) a processing liquid supply path for supplying a processing liquid to said processing part, said processing liquid supply path having:
   (b-1) a first measuring element for obtaining a first measured concentration value by measuring a concentration of an inert gas of said processing liquid in a first state, said concentration of said inert gas of said processing liquid in said first state being not adjusted,
   (b-2) a concentration change element comprising first and second groups of a plurality of hollow fiber type separation membranes housed in a single body for changing said processing liquid into a second state by changing said concentration of said inert gas of said processing liquid in said first state, and
   (b-3) a second measuring element for obtaining a second measured concentration value by measuring said concentration of said inert gas of said processing liquid in said second state; and
   (c) a controlling element for controlling said concentration of said inert gas of said processing liquid in said second state toward a predetermined target concentration by controlling said concentration change element, such that said concentration of said inert gas of said processing liquid is caused to be changed by both dissolving said inert gas in said processing liquid through said first group of said plurality of hollow fiber type separation membranes and degassing said inert gas from said processing liquid through said second group of said plurality of hollow fiber type separation membranes based on said first and second measured concentration values.

2. The substrate processing apparatus according to claim 1, further comprising:
   (d) a first flow adjusting element for adjusting the flow of said inert gas supplied to said concentration change element; and (e) a second flow adjusting element for adjusting the flow of said inert gas degassed from said concentration change element, wherein said controlling element controls dissolving through said first group of said plurality of hollow fiber type separation membranes by controlling said first flow adjusting element based on a difference between said first measured concentration value and said target concentration, and controls degassing through said second group of said plurality of hollow fiber type separation membranes by controlling said second flow adjusting element based on a difference between said second measured concentration value and said target concentration.

3. The substrate processing apparatus according to claim 1 wherein said processing part and one part of said processing liquid supply path constitutes a first unit, said first measuring element, said concentration change element, said second measuring element, said controlling element and the other part of said processing liquid supply path constitutes a second unit, and said processing liquid supply path effects a processing liquid supply from said second unit to said first unit.

4. A substrate processing apparatus comprising:
(a) a processing part for performing a predetermined process of a substrate with a processing liquid;
(b) a processing liquid supply path for supplying a processing liquid to said processing part, said processing liquid supply path having:
(b-1) a first measuring element for obtaining a first measured concentration value by measuring a concentration of an inert gas of said processing liquid in a first state, said concentration of said inert gas of said processing liquid in said first state being not adjusted;
(b-2) a concentration change element for changing said processing liquid into a second state by changing said concentration of said inert gas of said processing liquid in said first state, comprising:
(b-2-1) a dissolving element for dissolving said inert gas in said processing liquid; and
(b-2-2) a degassing element for degassing said inert gas from said processing liquid; and
(b-3) a second measuring element for obtaining a second measured concentration value by measuring said concentration of said inert gas of said processing liquid in said second state; and (c) a controlling element configured to control said concentration of said inert gas of said processing liquid in said second state toward a predetermined target concentration by controlling said dissolving element and said degassing element, wherein said dissolving element and said degassing element are arranged in series on said processing liquid supply path with no branch therebetween, and said concentration of said inert gas of said processing liquid in said second state is changed by either or both dissolving said inert gas in said processing liquid at said dissolving element and degassing said inert gas from said processing liquid at said degassing element, said controlling element deciding which of said either or both dissolving said inert gas in said processing liquid at said dissolving element and degassing said inert gas from said processing liquid at said degassing element is to be performed based on said first and second measured concentration values.

5. The substrate processing apparatus according to claim 4, further comprising:
(d) a first flow adjusting element for adjusting the flow of said inert gas supplied to said dissolving element; and
(e) a second flow adjusting element for adjusting the flow of said inert gas degassed from said degassing element, wherein said controlling element controls dissolving on said dissolving element by controlling said first flow adjusting element based on a difference between said first measured concentration value and said target concentration, and controls degassing on said degassing element by said second flow adjusting element based on a difference between said second measured concentration value and said target concentration.

6. The substrate processing apparatus according to claim 5 wherein said degassing element is located upstream from said dissolving element on said processing liquid supply path.

7. The substrate processing apparatus according to claim 5 wherein said dissolving element is located upstream from said degassing element on said processing liquid supply path.

* * * * *